United States Patent [19]

Mako et al.

[11] Patent Number: 5,015,943
[45] Date of Patent: May 14, 1991

[54] HIGH POWER, HIGH SENSITIVITY MICROWAVE CALORIMETER

[75] Inventors: Frederick M. Mako, Fairfax Station; John A. Pasour, Springfield, both of Va.

[73] Assignee: The United States of America as represented by the Secretary of the Navy, Washington, D.C.

[21] Appl. No.: 354,559

[22] Filed: May 22, 1989

[51] Int. Cl.$^5$ ............................................. G01R 23/04
[52] U.S. Cl. ...................................... 324/95; 324/96; 324/106; 374/32
[58] Field of Search .................. 374/31, 32, 122, 161; 324/95, 96, 106; 340/600; 356/345, 358

[56] References Cited

U.S. PATENT DOCUMENTS

| | | | |
|---|---|---|---|
| 2,995,708 | 8/1961 | Hudson et al. | 324/95 |
| 3,034,355 | 5/1962 | Butler | 374/32 |
| 3,081,430 | 3/1963 | Hopfer | 324/95 |
| 3,115,131 | 12/1963 | Holliday | 324/95 |
| 3,212,002 | 10/1965 | Weibel | 324/95 |
| 3,234,463 | 2/1966 | Lederman et al. | 324/95 |
| 3,384,819 | 5/1968 | Rinkel | 324/106 |
| 3,828,251 | 8/1974 | Webb | 324/95 |
| 4,378,497 | 3/1983 | Giallorenzi | 324/96 |
| 4,522,511 | 6/1985 | Zimmerer | 374/32 |
| 4,533,829 | 8/1985 | Miceli et al. | 324/96 |
| 4,575,259 | 3/1986 | Bacci et al. | 374/161 |
| 4,609,871 | 9/1986 | Bobb | 324/225 |
| 4,671,659 | 6/1987 | Rempt et al. | 356/358 |
| 4,733,170 | 3/1988 | McAllister et al. | 324/95 |
| 4,740,763 | 4/1988 | Wilhelm et al. | 333/22 F |
| 4,754,238 | 6/1988 | Schüller et al. | 333/22 F |
| 4,859,059 | 8/1989 | Bobb et al. | 356/345 |

Primary Examiner—Kenneth Wieder
Assistant Examiner—William J. Burns
Attorney, Agent, or Firm—Thomas E. McDonnell; George Jameson

[57] ABSTRACT

A microwave calorimeter is disclosed for substantially measuring the total microwave energy in an applied microwave pulse. The microwave calorimeter includes: a housing having a highly reflective interior surface, a microwave absorbing device disposed in the housing for substantially absorbing microwave energy transmitted into the housing and for producing a thermal response proportional to the amount of microwave energy being absorbed, and a measurement device responsive to the thermal response for determining the amount of microwave energy being absorbed by the microwave absorbing device.

10 Claims, 3 Drawing Sheets

HIGH POWER, HIGH SENSITIVITY MICROWAVE CALORIMETER

BACKGROUND OF THE INVENTION

1. Field of the Invention

The present invention relates to a microwave calorimeter and particularly to a microwave calorimeter which measures total microwave energy with a high energy sensitivity at both high and low power levels.

2. Description of the Prior Art

Many different apparatuses have been proposed for measuring the total microwave energy of an applied microwave signal or pulse.

One type of apparatus for measuring total microwave energy is a temperature sensing calorimeter which determines the energy of an applied microwave pulse by measuring the rise in temperature of a load which absorbs the applied microwave energy. This energy absorbing load can be, for example, a microwave absorbing fluid (such as water or octonal) or a microwave-absorbing ceramic (in, for example, the form of a hollow cylinder). However, such temperature sensing calorimeters are insensitive at lower microwave energies and get more insensitive at longer wavelengths.

Another type of apparatus for measuring total microwave energy is a pyroelectric detector which converts the microwave energy impinging thereon into an electrical signal proportional to the applied energy level. However, Basically such pyroelectric detectors are only good for low power levels at short wavelengths.

OBJECTS OF THE INVENTION

Accordingly, one object of the invention is to provide an improved microwave calorimeter.

Another object of the invention is to provide a microwave calorimeter which measures the total microwave energy of an applied microwave pulse with a high energy sensitivity at both high and low power levels.

Another object of the invention is to provide a microwave calorimeter which has high sensitivity at low microwave energies and high power operation over a large frequency bandwidth.

Another object of the invention is to provide a microwave calorimeter which substantially measures the total energy in an applied microwave pulse as a function of a thermal response produced by a microwave absorbing device.

Another object of the invention is to provide a microwave calorimeter which substantially measures the total energy in an applied microwave pulse as a function of the increase in length of a fiber bundle which absorbs the microwave energy.

A further object of the invention is to provide a microwave calorimeter which substantially measures the total energy in an applied microwave pulse as a function of the total amount of thermal stress respectively placed on a plurality of piezoelectric crystals by an associated plurality of rods which absorb the applied microwave energy.

SUMMARY OF THE INVENTION

These and other objects are achieved in the present invention by providing a microwave calorimeter for substantially measuring the total microwave energy in an applied microwave pulse. The microwave calorimeter comprises: a housing having a highly reflective interior surface and an aperture; means for transmitting microwave energy into said aperture of said housing; a microwave energy absorbing device disposed in said housing for absorbing microwave energy transmitted into said housing and for producing a thermal response proportional to the amount of microwave energy being absorbed; and means responsive to said thermal response for determining the amount of microwave energy being absorbed by said device.

BRIEF DESCRIPTION OF THE DRAWINGS

These and other objects, features and advantages of the invention, as well as the invention itself, will become better understood by reference to the following detailed description when considered in connection with the accompanying drawings wherein like reference numerals designate identical or corresponding parts throughout the several views, and wherein.

DETAILED DESCRIPTION OF THE PREFERRED EMBODIMENTS

Figure 1:
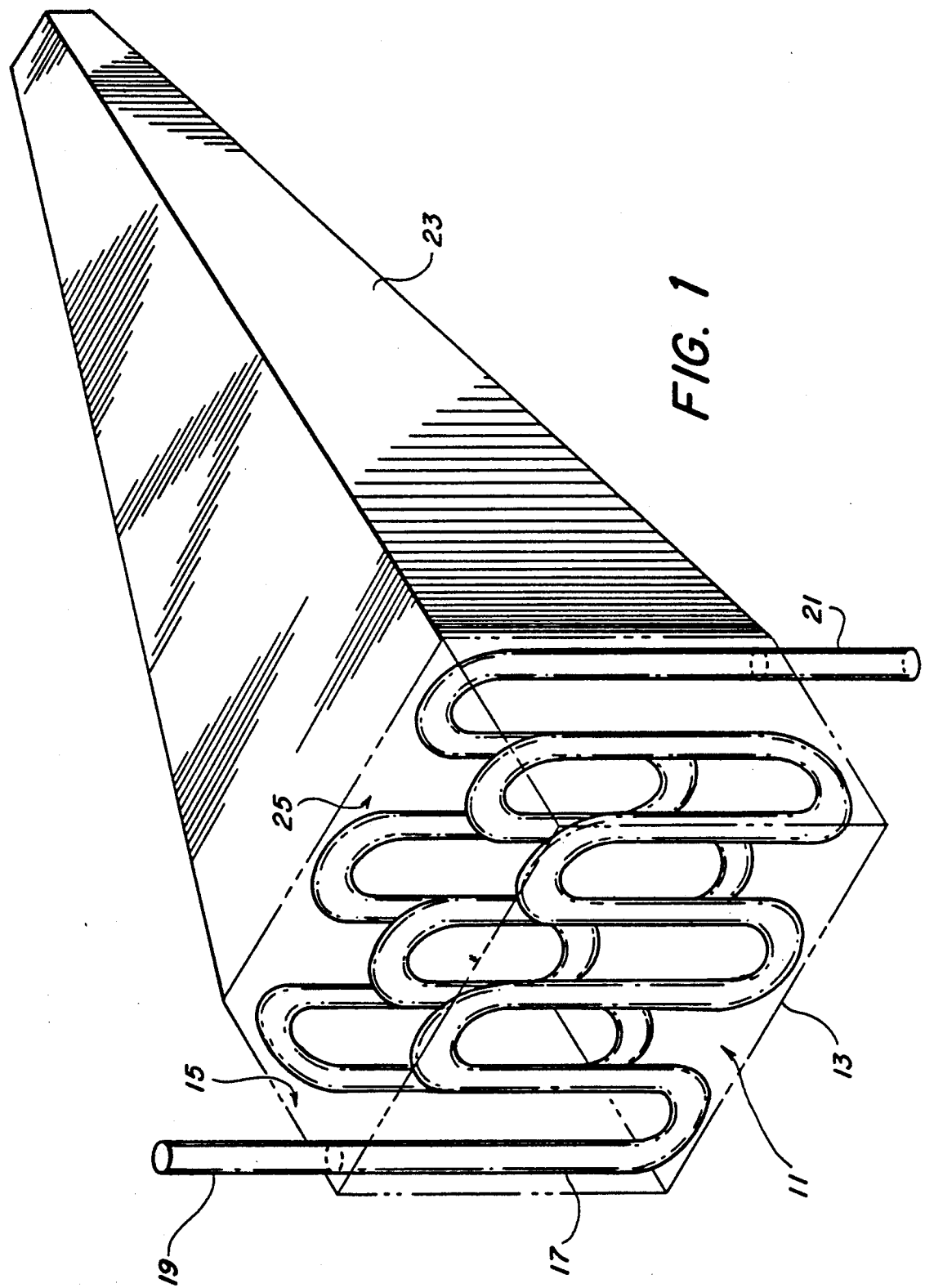
FIG. 1 illustrates an enlarged portion of a first embodiment of the invention.

Referring to FIG. 1, an enlarged portion of a first embodiment of the invention is illustrated. As shown, a microwave energy absorbing device 11 is housed in a closed box or housing 13, having an interior surface 15 which is preferably made of a high conductivity metal, such as copper, aluminum, gold, silver or platinum. As a result, the interior surface 15 of the box 13 is highly reflective.

In the embodiment of FIG. 1 the microwave absorbing device 11 is specifically shown as a long fiber optic bundle 17 of a preselected unheated length. The bundle 17 can be formed from a continuous run or length of any typical optical fiber, such as plastic, glass or any other optically suitable material. The fiber optic bundle 17 is bent back and forth (like a picket fence) so as to occupy, but not fill, the entire volume of the conducting box 13. Input and output end portions 19 and 21 of the fiber optic bundle 17 pass out of the conducting box 13. A microwave horn 23 is coupled electrically to the conducting box 13. The interior surface (not shown) of the horn 23 is also made of a highly conductive or reflective metal, such as copper, aluminum, gold, silver or platinum.

In operation, a pulse of microwave energy of, for example, one microsecond in duration is transmitted into the microwave horn 23 by way of a waveguide (not shown). This pulse of microwave energy passes through the horn 23 and an aperture 25 in the rear of the box 13 and into the conducting box 13.

When the pulse of microwave energy enters the conducting box 13, part of that energy will scatter off the fiber optic bundle 17, while some of that energy is absorbed by the bundle 17. Since the bundle 17 is arranged like a picket fence and does not uniformly fill the volume of the conducting box 13, multiple scattering of microwave energy will occur off of the highly reflective interior surface 15 of the box 13 and off of the bundle 17, with a portion of the microwave energy being absorbed on each pass. Thus, even though the absorption per pass is small, after many passes most of the microwave energy will be absorbed in the bundle 17.

After absorbing the microwave energy, the fiber optic bundle 17 will have thermally expanded thus increasing its length. This length increase of the bundle 17 is a thermal response which is directly proportional to the amount of microwave energy being absorbed by the bundle 17 and, hence, it is also directly proportional to the total microwave energy in the applied microwave pulse. This length increase of the bundle 17 can be measured using a laser and an interferometer to produce an optical interference signal. The complete first embodiment of the invention accomplishes this measurement and will be discussed by now referring to FIG. 2.

Figure 2:
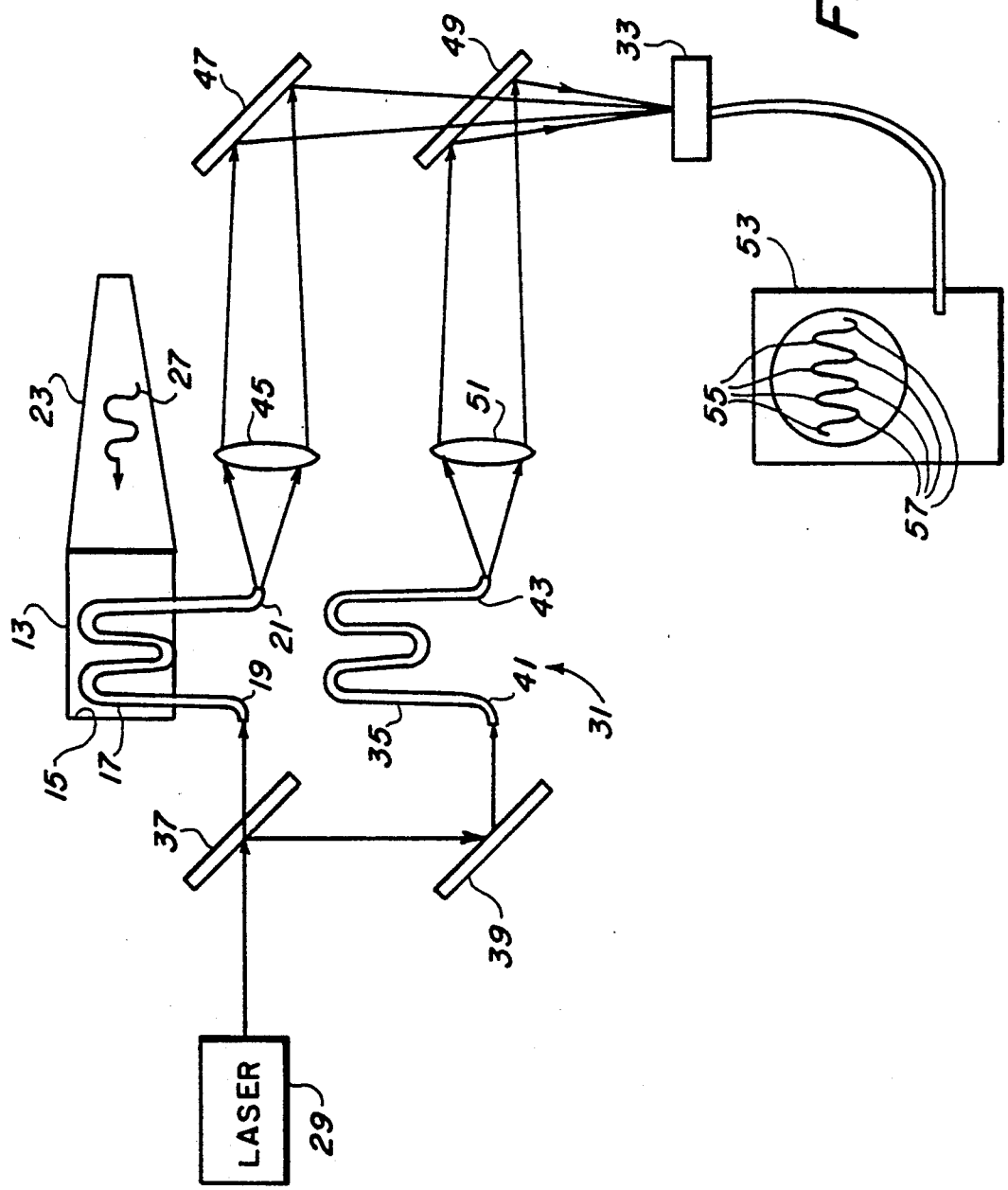
FIG. 2 illustrates the complete first embodiment of the invention, including the portion shown in FIG. 1.

As shown in FIG. 2 microwaves 27 are transmitted into the microwave horn 23. As explained before in the description of FIG. 1, this microwave energy is absorbed by the fiber optic bundle 17 after multiple scattering of the microwave energy from the heated bundle 17 and the highly reflective interior surface 15 of the conducting box or housing 13. The absorption of this microwave energy by the fiber optic bundle 17 causes the bundle to thermally expand and increase its length as a function of the amount of absorbed energy.

To measure the length increase of the fiber optic bundle 17, a laser 29 and an interferometer 31, which includes the bundle 17, is utilized to produce an optical interference pattern or signal. This optical interference signal is then detected by an optical detector or photodetector 33 to produce an electrical signal which is proportional to the amount of absorbed energy.

The laser 29 can be, for example, a helium-neon laser. The interferometer 31 includes an unheated reference fiber optic bundle 35 of a fixed length.

In the operation of the embodiment of FIG. 2, light from laser 29 is transmitted to a beam splitter 37, with approximately one half of the laser light being transmitted through the beam splitter 37 into the input end portion 19 of the heated bundle 17. The approximate other half of the laser light is sequentially reflected from the beam splitter 37 and a mirror 39 into an input end portion 41 of the unheated bundle 35. Due to the thermal expansion of the bundle 17 upon its absorption of the input microwave energy, the light beams in the bundles 17 and 35 travel different distances through those bundles. As a result, the light beam leaving the output end portion 21 of bundle 17 is out of phase with the light beam leaving output end portion 43 of bundle 35.

Light from the output end portion 21 of bundle 17 is collected by a collecting lens 45 and directed by the lens 45 to a mirror 47, which reflects it to a beam splitter 49. Similarly, light from the output end portion 43 of bundle 35 is collected by a collecting lens 51 and directed by the lens 51 to the beam splitter 49. The beam splitter 49 will pass approximately one half of the light beam from the mirror 47 to the photodetector 33, and will reflect approximately one half of the light beam from the lens 51 to the photodetector 33. Thus, the beams leaving the beam splitter 49 add together and form an optical interference pattern. This optical interference pattern can be photodetected by the photodetector 33 and applied to an oscilloscope 53. The interference pattern can be displayed by other means, such as photographically.

The number of interference peaks 55 or minima 57 (fringe shifts) in the detected interference pattern output of photodetector 33 is then counted on the oscilloscope 53 to establish an accurate measurement of the length increase of the fiber optic bundle 17. This length increase of the bundle 17 is directly proportional to the amount of microwave energy absorbed by the bundle 17.

The absorbed microwave energy, Q, can be calculated by substituting the value of the measured length increase $\Delta l$ of the heated bundle 17 into the following equation (1):

$$Q = \Delta l \rho A\, C p / \alpha \qquad (1)$$

where:
Q = absorbed microwave energy
$\Delta l$ = change in length of bundle 17 due to thermal expansion
$\rho$ = mass density of the fiber in the bundle 17
A = total cross-sectional area of the fiber in the bundle 17
Cp = heat capacity of the fiber in the bundle 17, and
$\alpha$ = linear thermal expansion coefficient of the fiber in the bundle 17.

The units of absorbed microwave energy could be directly read from the oscilloscope 53 by using an oscilloscope overlay (not shown) which is calibrated according to equation (1).

The main advantages of this embodiment are high sensitivity at low (as well as high) microwave energies and high power operation over a larger frequency bandwidth. Here, high sensitivity does not require a low mass absorber (which imposes a short wavelength limitation). The sensitivity of this embodiment is essentially independent of mass in the region of interest (length increase). This result occurs because the measured variable (the thermal expansion length difference between the bundles 17 and 35) does not depend on the initial fiber length of the bundles 17 and 35. This conclusion can be clearly seen in equation (1). Another advantage is that the fiber optic material of the bundles 17 and 35 does not have to be a good microwave energy absorber, since microwave absorption occurs over many passes through the fiber.

Figure 3:
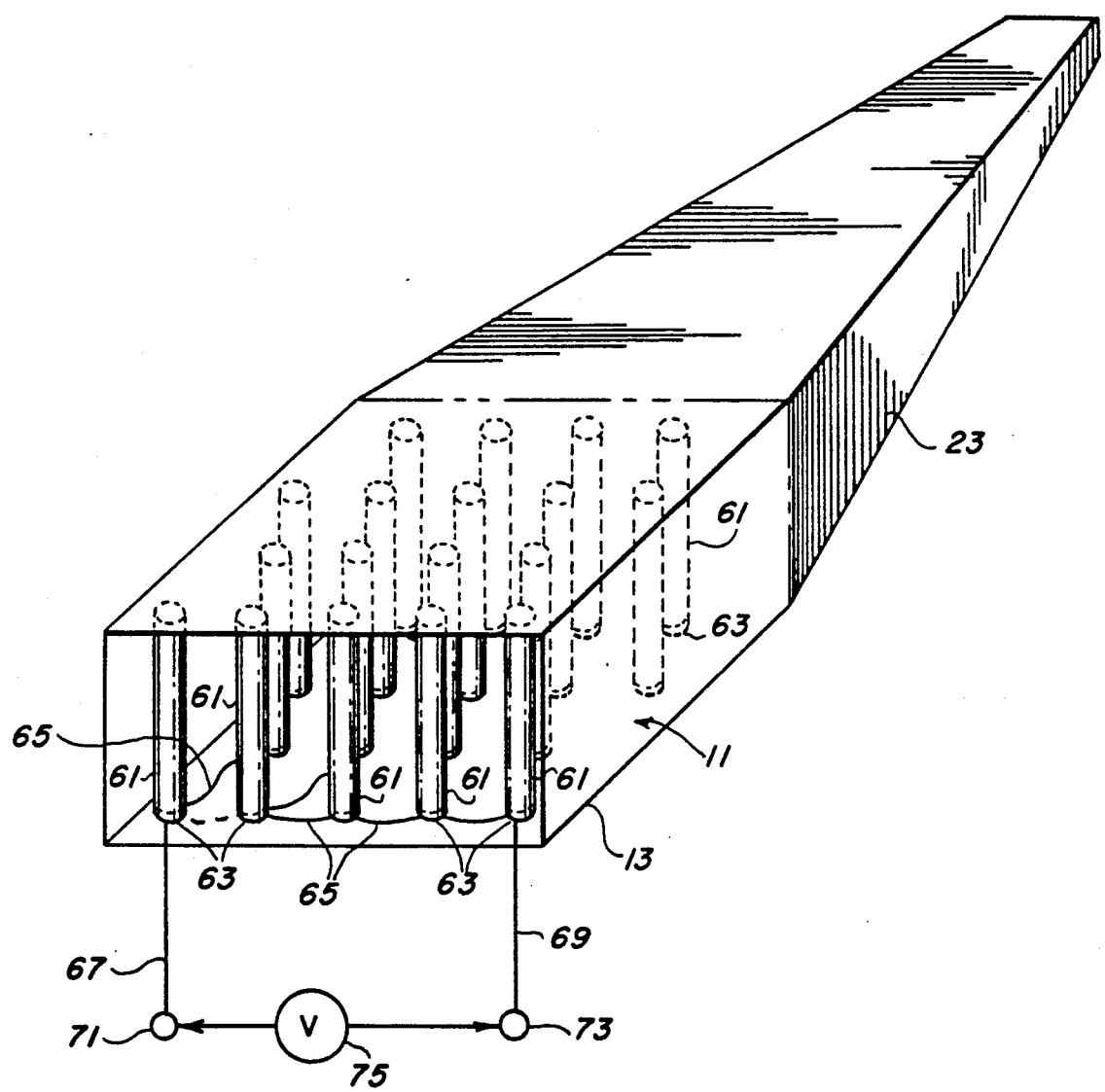
FIG. 3 illustrates a second embodiment of the invention.

A second embodiment of the invention is shown in FIG. 3. In this embodiment, instead of measuring the length increase due to thermal expansion, the thermal stress is measured to determine the amount of microwave energy being absorbed. Thus, in FIG. 3 the thermal response is thermal stress.

In FIG. 3, optical fibers or optical fiber bundles are not needed to measure the thermal response. Instead, the microwave absorbing device 11 in the conducting box or housing 13 consists of short rods 61 in a picket fence arrangement that again occupies the volume of the conducting box 13 without filling it. The rods 61 can be, for example, glass or plastic. A piezoelectric crystal 63 is located at the bottom of each rod 61. The piezoelectric crystals 63 are serially connected together by thin wires 65, with the ends of the serially-connected crystals 63 connected by means of leads 67 and 69 to respective terminals 71 and 73 of a voltage detecting device 75.

When a pulse of microwave energy is transmitted into the microwave horn 23 by way of a waveguide (not shown), it passes through the horn 23 and enters the conducting box 13, causing the rods 61 to absorb the energy. Since the rods 61 are arranged like a picket fence and do not fill the volume of the box 13 uniformly, multiple scattering occurs (as it did in the embodiment of FIG. 2. Thus, even though the absorption per pass is small, after many passes most of the microwave energy in the applied microwave pulse will be absorbed by the rods 61. This absorption of the microwave energy causes each of the rods 61 to heat up. Upon being heated each rod 61 tries to expand and consequently exerts a mechanical force against its associated crystal 63 which, in turn, produces a voltage across its associated crystal 63. The voltages from all of the serially-connected crystals 63 add together, with the total voltage produced by the crystals 63 appearing between the terminals 71 and 73. A voltage detecting device 75, such as a voltmeter, can be used to measure this total voltage, which is proportional to the amount of absorbed microwave energy. It should be noted that a voltage measurement must be made within the decay time of the piezoelectric crystals 63.

It should be noted that each of the crystals 63 has an associated calibration chart that relates the voltage across each crystal 63 with the force required to produce that voltage. Thus, if the crystals 63 are chosen so that they all have the same calibration chart, the total force or thermal stress exerted on the crystals 63 by the heated rods 61 could be readily calculated by determining from one calibration chart the force representative of the voltage produced by one crystal 63 times the number of crystals 63.

However, if the crystals 63 have different calibration charts, then the voltage of each of the crystals 63 would have to be separately measured and converted to an associated force by using the associated calibration charts. Then the total force can be calculated by adding all of the individual forces exerted on the crystals 63.

The total microwave energy absorbed by the rods 61 can be calculated by substituting the value of the total force, F, into the following equation (2):

$$Q = F\rho L\, C_p / Y\alpha \qquad (2)$$

where:
Q = absorbed microwave energy
F = total thermal force
$\rho$ = mass density of rods 61
L = original (unheated) length of the rods 61
$C_p$ = heat capacity of the rods 61
Y = Young's modulus of the absorber rods 61
$\alpha$ = linear thermal expansion coefficient of the rods 61

The units of absorbed microwave energy could be directly read from the voltmeter 75 by calibrating the voltmeter 75 according to equation (2). In an alternative arrangement, a computer (not shown) utilizing an analog-to-digital converter (not shown) could be substituted for the voltmeter 75 and the total voltage (from matched crystals with the same calibrations) applied to the computer. The other known values in equation (2), as well as a table for converting the total crystal voltage to a total force, could be stored in the computer. The computer would then compute and read out the value of Q according to equation (2).

This second embodiment, like the first embodiment, also has the advantages of high sensitivity at low (as well as high) microwave energies and high power operation over a larger frequency bandwidth. In addition, this second embodiment does not require small masses for high sensitivity, because the force generated is roughly independent of the absorbing mass of the rods 61. This conclusion can be clearly reached by referring back to equation (2).

The invention in both embodiments can operate in an exemplary energy range of from $10^{-9}$ joules to 100 joules and in the exemplary frequency range of from 1 to 100 gigahertz. It should also be noted that thermal expansion or stress measurements must be made within the thermal decay time of the fiber bundle 17 (FIG. 2) or rods 61 (FIG. 3). Thermal decay times can be lengthened by evacuating the interior volume of the box 13 where the fiber bundle 17 or rods 61 exist.

Therefore, what has been described is a microwave calorimeter which substantially measures the total energy in an applied microwave pulse as a function of the thermal response produced by a microwave absorbing device which substantially absorbs the total energy in the microwave pulse.

It should therefore readily be understood that many modifications and variations of the present invention are possible within the purview of the claimed invention. For example, a person skilled in the art of microwave detection could add impedance matching techniques, such as tailoring the profile of either the fiber bundle or rod system and making the conducting box 13 (which houses the fiber bundle 17 or rods 61) larger than the outlet (not shown) of the horn 23. It is therefore to be understood that, within the scope of the appended claims, the invention may be practiced otherwise than as specifically described.

What is claimed and desired to be secured by Letters Patent of the United States is:

1. A microwave calorimeter for substantially measuring the total microwave energy in an applied microwave pulse, said microwave calorimeter comprising:

a housing having a highly reflective interior surface;
means for transmitting microwave energy into said housing;
a microwave absorbing device disposed in said housing for absorbing microwave energy transmitted into said housing and for producing a thermal response proportional to the amount of microwave energy being absorbed, said microwave absorbing device including a first fiber optic bundle of a preselected unheated length responsive to the absorption of said microwave energy for producing a thermal response of an increase in length of said fiber optic bundle, said length increase being proportional to the amount of said microwave energy absorbed by said fiber optic bundle; and
means responsive to said thermal response for determining the amount of microwave energy being absorbed by said device.

2. The microwave calorimeter of claim 1 wherein:
said first fiber optic bundle is arranged in a preselected configuration within said housing to substantially absorb said microwave energy after multiple scattering of said microwave energy from said first fiber optic bundle and said highly reflective interior surface of said housing.

3. The microwave calorimeter of claim 2 wherein:
said first fiber optic bundle is arranged in a configuration whereby the fiber optic bundle is bent back and forth so as to occupy the volume of said housing without filling said volume.

4. The microwave calorimeter of claim 1 wherein said determining means includes:
a second fiber optic bundle of said preselected unheated length;

laser means for transmitting substantially equal first and second portions of light into said first and second fiber optic bundles;

means responsive to said first and second portions of light from said first and second fiber optic bundles for producing an output interference pattern indicative of the difference in path lengths through said first and second fiber optic bundles;

means for detecting the output interference pattern to produce a signal indicative of the length increase of said first fiber optic bundle; and output means responsive to said signal for determining the amount of microwave energy absorbed by said first fiber optic bundle.

5. The microwave calorimeter of claim 4 wherein said output means includes;

a display unit calibrated to convert said signal to an indication of the amount of microwave energy absorbed by said first fiber optic bundle.

6. The microwave calorimeter of claim 4 wherein:

said first fiber optic bundle is arranged in a preselected configuration within said housing to substantially absorb said microwave energy after multiple scattering of said microwave energy from said first fiber optic bundle and said highly reflective interior surface of said housing.

7. The microwave calorimeter of claim 6 wherein:

said first fiber optic bundle is arranged in a configuration in which the fiber optic bundle is bent back and forth so as to occupy the volume of said housing without filling said volume.

8. The microwave calorimeter of claim 4 wherein said transmitting means includes:

a microwave feedhorn electrically coupled to said housing for passing microwave energy applied thereto into said housing, each of said microwave horn and said housing having an interior surface made of a high conductivity metal.

9. The microwave calorimeter of claim 8 wherein:

said high conductivity metal of the interior surface of each of said microwave horn and said housing is selected from the group consisting of gold, silver, platinum, copper and aluminum, or a mixture thereof.

10. The microwave calorimeter of claim 8 wherein:

said housing includes an aperture to enable microwave energy to pass from said microwave feedhorn into said housing.

* * * * *